US006955554B2

(12) United States Patent
Korsunsky et al.

(10) Patent No.: US 6,955,554 B2
(45) Date of Patent: Oct. 18, 2005

(54) ELECTRICAL CONNECTOR ASSEMBLY HAVING BOARD HOLD DOWN

(75) Inventors: Iosif R. Korsunsky, Harrisburg, PA (US); Robert W. Brown, Harrisburg, PA (US); Joanne E. Shipe, Harrisburg, PA (US); Wei-Chen Lee, Harrisburg, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/766,158

(22) Filed: Jan. 27, 2004

(65) Prior Publication Data

US 2005/0164540 A1 Jul. 28, 2005

(51) Int. Cl.[7] .............................................. H01R 13/62
(52) U.S. Cl. ...................................................... 439/328
(58) Field of Search ................................ 439/326–328, 439/571, 564, 567

(56) References Cited

U.S. PATENT DOCUMENTS 3,701,071 A * 10/1972 Landman .................... 200/5 R
3,848,952 A * 11/1974 Tighe, Jr. .................... 439/326
4,678,252 A * 7/1987 Moore ......................... 439/62
4,712,939 A 12/1987 Fujimoto
5,281,149 A 1/1994 Petrl
5,452,184 A * 9/1995 Scholder et al. ............ 361/799
5,484,302 A 1/1996 Yamada et al.
5,951,315 A * 9/1999 Ichimura .................... 439/326
6,234,820 B1 * 5/2001 Perino et al. ............... 439/326
6,773,268 B1 * 8/2004 Shipe et al. .................. 439/74
6,848,927 B2 * 2/2005 Shirai ......................... 439/326
2004/0152353 A1 * 8/2004 Kawamae ................... 439/328
2005/0048828 A1 * 3/2005 Ho et al. .................... 439/326

* cited by examiner

*Primary Examiner*—Hae Moon Hyeon
(74) *Attorney, Agent, or Firm*—Wei Te Chung

(57) ABSTRACT

An electrical connector assembly (1) includes a mother board (10), a card edge connector (20) mounted on the mother board, a daughter card (30), and a pair of board hold downs (40) mounted on the mother board. The card edge connector includes a housing (21) defining a slot (22), and a number of contacts (23) disposed on opposite sides of the slot and exposed into the slot. The daughter card includes a mating edge (31) inserted into the slot of the housing, a number of conductive pads (33) on the mating edge for electrically connecting with the contacts of the card edge connector. The board hold downs are separated from the card edge connector and hold the daughter card in the card edge connector.

13 Claims, 5 Drawing Sheets

ELECTRICAL CONNECTOR ASSEMBLY HAVING BOARD HOLD DOWN

BACKGROUND OF THE INVENTION

1. Field of the Invention

The present invention relates to an electrical connector assembly, and particularly to an assembly having a board hold down for detachably holding a circuit board to another circuit board thereof.

2. Description of Related Art

Card edge connectors, such as PCI and PCI Express connectors, are widely used to connect daughter cards and mother boards. Typically, each of the card edge connectors generally comprises an elongate housing defining an elongate slot for receiving a mating edge of the daughter card, a plurality of terminals are spaced along one or both sides of the slot for engaging conductive pads disposed on the mating edge of the daughter card, and a pair of latch members attached to opposite ends of the housing. For example, U.S. Pat. No. 5,484,302 (the '302 patent) shows such a card edge connector.

The card edge connector of the '302 patent is arranged to be mounted on a mother board and to finally hold a daughter card, which is inserted at an angle relative to the housing, in an orientation which is parallel to the mother board. The card edge connector has discrete metal latches held in guide frames which extend outwardly from opposite ends of a housing. A plurality of terminals are received in the housing and have solder tails which are electrically connected to the mother board by surface mount soldering. The latches have integral solder tabs which are also attached to the mother board by surface mounting soldering to increase the retention of the card edge connector to the mother board and to reduce stresses imposed on the solder connections of the terminals. The solder tails of the terminals and the solder tabs of the latches must be coplanar so that good solder joints can be produced, but it is difficult to ensure a close coplanarity tolerance on these parts. Also, the latches should extend precisely perpendicular to the housing for effective latching of the daughter card and for proper alignment with solder pads on the mother board. There is a need for the card edge connector with improved control for positioning of the latches. Further, the guide frames increase a longitudinal dimension of the housing, so a large space of the mother board is needed to accommodate the card edge connector. This problem is sometimes undesired where several card edge connectors are arranged on the mother board side by side. The similar card edge connectors having the integrally formed latches thereof, are also shown in U.S. Pat. Nos. 5,997,332 and 6, 663,407.

Hence, an electrical connector assembly having an improved board hold down to solve the above problems is desired. It is noted that U.S. Pat. No. 4,712,939 discloses a separate fixation member 17 mounted on the plate to retain the rear edge section of a printed circuit board, of which the front edge section is inserted into the substrate support 15, in a parallel manner. U.S. Pat. No. 5,281,149 further discloses an upper circuit board being spatially retained above the lower circuit board in a parallel manner by a discrete board locking member (14/45). Thus, based upon the aforementioned patents, it is naturally desired to change the latch structure, which is integrally located on the housing of the card edge connector, to a separate latch device which is independently/discretely mounted on the mother board instead of mounting to the housing of the card edge connector. The invention further defines a specific type latch structure for compliance with the mother board structure, the daughter board structure and the moving path of the inserted daughter board.

SUMMARY OF THE INVENTION

An object of the present invention is to provide an electrical connector assembly having a daughter card which can precisely engage with a card edge connector thereof.

Another object of the present invention is to provide an electrical connector assembly having a card edge connector which occupies a small space of a mother board thereof.

To achieve the above objects, an electrical connector assembly in accordance with the present invention comprises a mother board, a card edge connector mounted on the mother board, a daughter card, and a pair of board hold downs mounted on the mother board. The card edge connector includes a housing defining a slot, and a plurality of contacts disposed on opposite sides of the slot and exposed into the slot. The daughter card includes a mating edge inserted into the slot of the housing, a plurality of conductive pads on the mating edge for electrically connecting with the contacts of the card edge connector. The board hold downs are separated from the card edge connector and hold the daughter card in the card edge connector.

Other objects, advantages and novel features of the invention will become more apparent from the following detailed description when taken in conjunction with the accompanying drawings.

DETAILED DESCRIPTION OF THE PREFERRED EMBODIMENT

Figure 1:
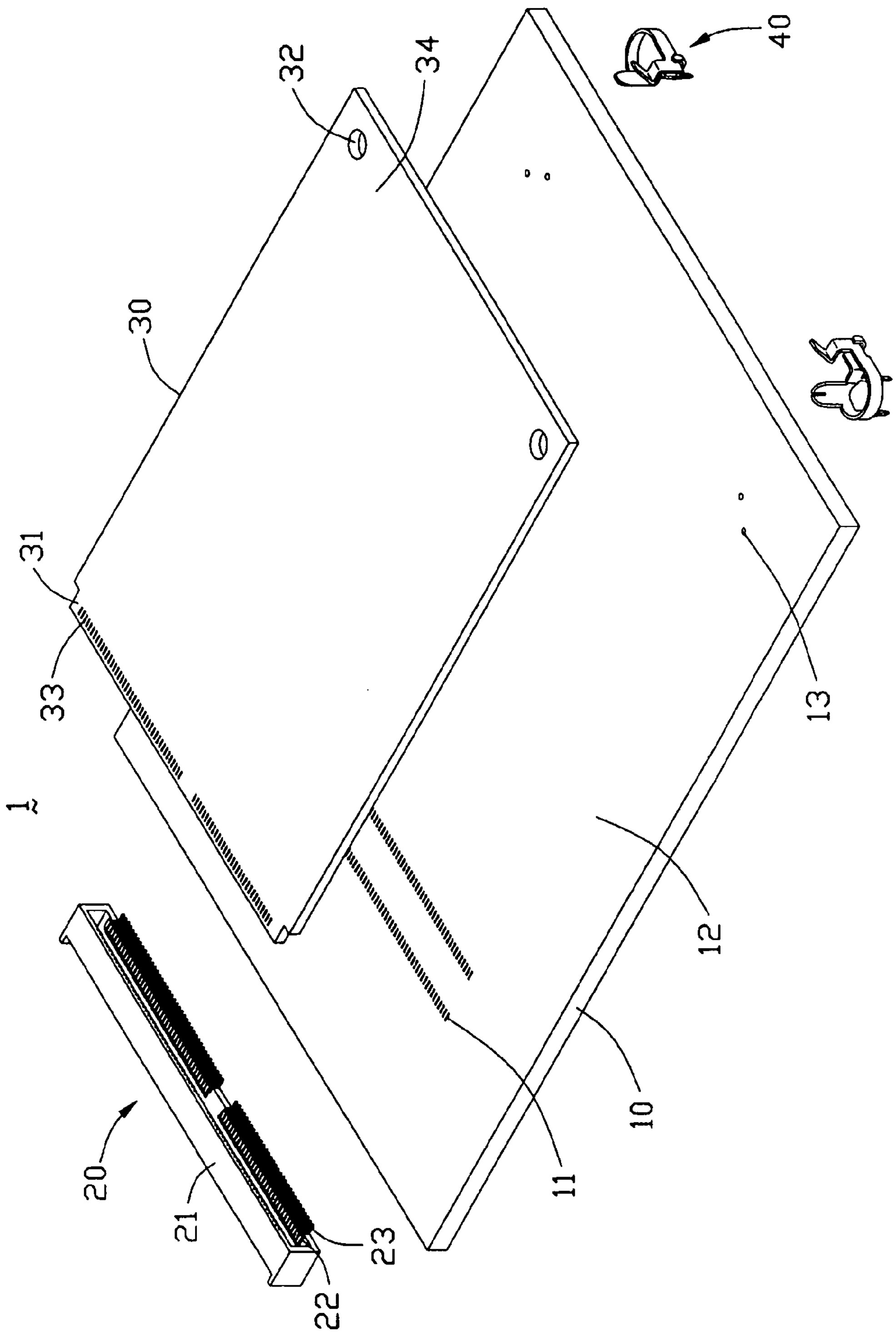
FIG. 1 is an exploded perspective view of an electrical connector assembly in accordance with the present invention.

Referring to FIG. 1, an electrical connector assembly 1 in accordance with the present invention comprises a mother board 10, a card edge connector 20, a daughter card 30, and a pair of board hold downs 40.

The mother board 10 comprises a plurality of solder pads 11 arranged on an upper surface 12 thereof adjacent to a front end thereof. Two pairs of retention holes 13 are defined adjacent to a rear end of the mother board 10. The card edge connector 20 comprises an elongate housing 21 defining a slot 22 having an opening at one side of card edge connector 20, and a plurality of contacts 23 disposed on opposite sides of the slot 22 and exposed into the slot 22. The daughter card 30 comprises a mating edge 31 at a front end thereof and defines a pair of engaging holes 32 adjacent to a rear edge 34 thereof. A plurality of conductive pads 33 are provided on opposite sides of the mating edge 31 of the daughter card 30.

Figure 2:
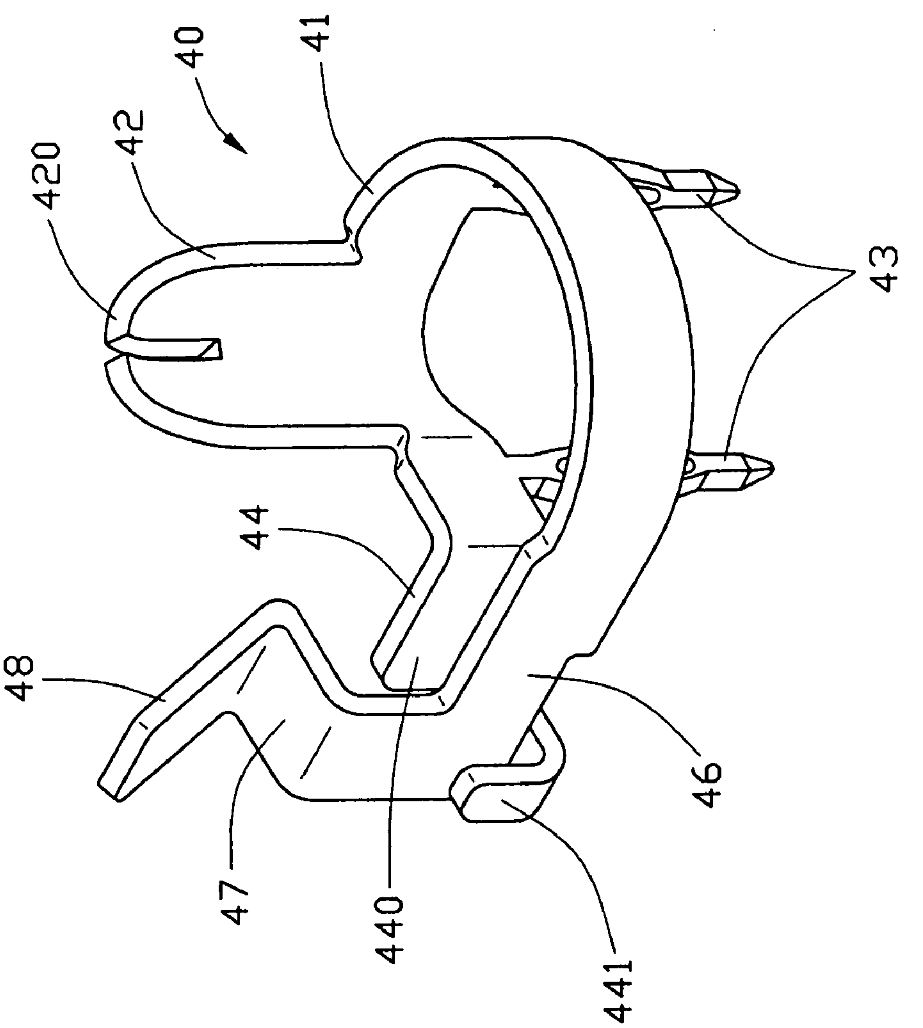
FIG. 2 is an enlarged perspective view of a board hold down of the electrical connector assembly of FIG. 1.

Referring to FIG. 2, each of the board hold downs 40 is stamped and formed from a sheet of metal and comprises an arc-shaped body portion 41, a locating portion 42 extending upwardly from the body portion 41 and having a conical lead-in 420 on a top end thereof, a pair of leg portions 43 extending downwardly from the body portion 41, a resilient arm 46 extending from a first end of the body portion 41, an anti-overstress portion 44 extending from a second end of the body portion 41, a latch portion 47 extending from the resilient arm 46, and a release portion 48 extending from the latch portion 47. The anti-overstress portion 44 comprises a main section 440 facing the resilient arm 46, and a tab 441 perpendicularly extending from the main section 440. A distal end of the tab 441 is bent upwardly. The resilient arm 46 rides on the tab 441 and is deflectable with the latch portion 47 between the main section 440 and the distal end of the tab 441.

Figure 3:
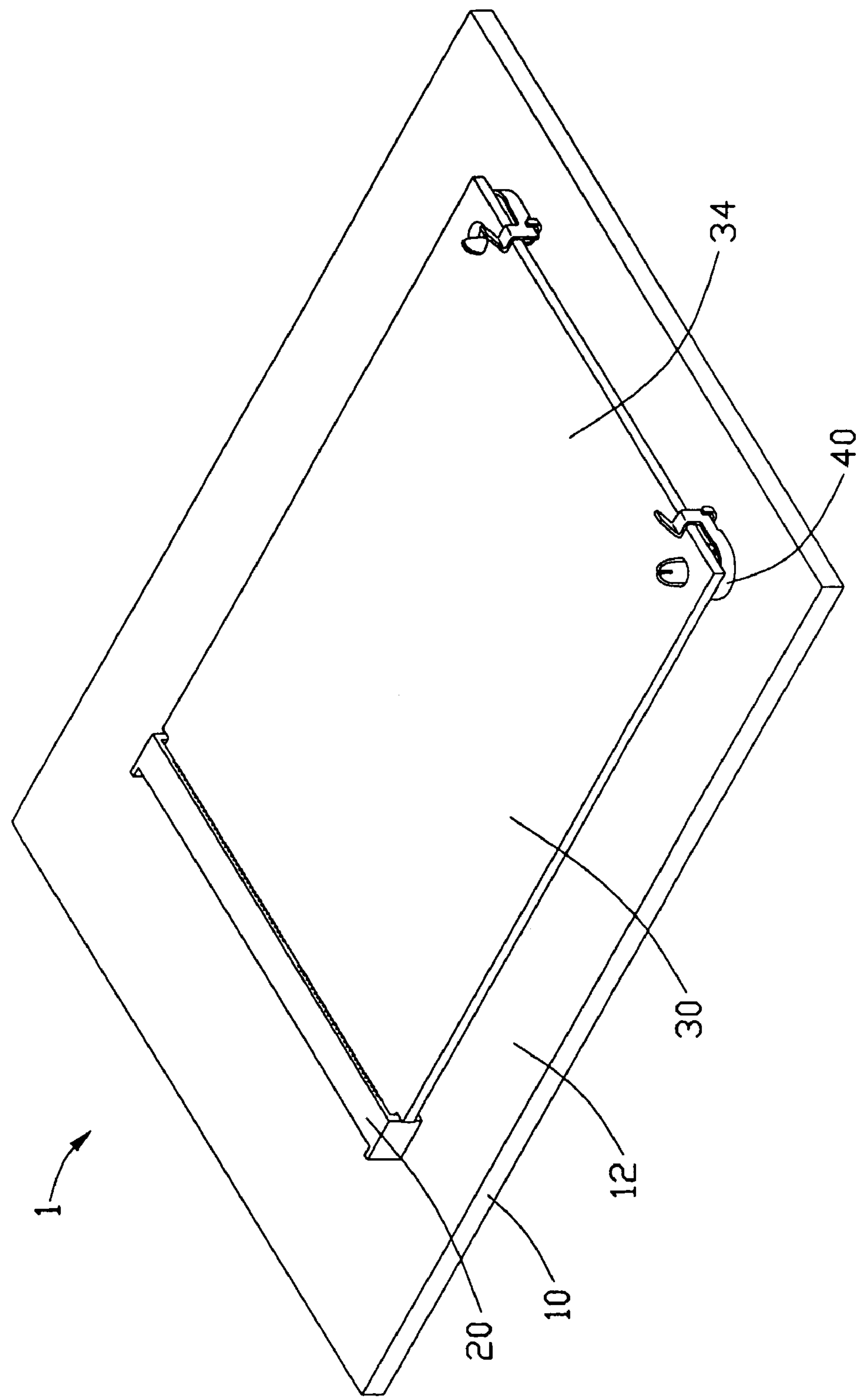
FIG. 3 is an assembled perspective view of the electrical connector assembly of FIG. 1.
Figure 4:
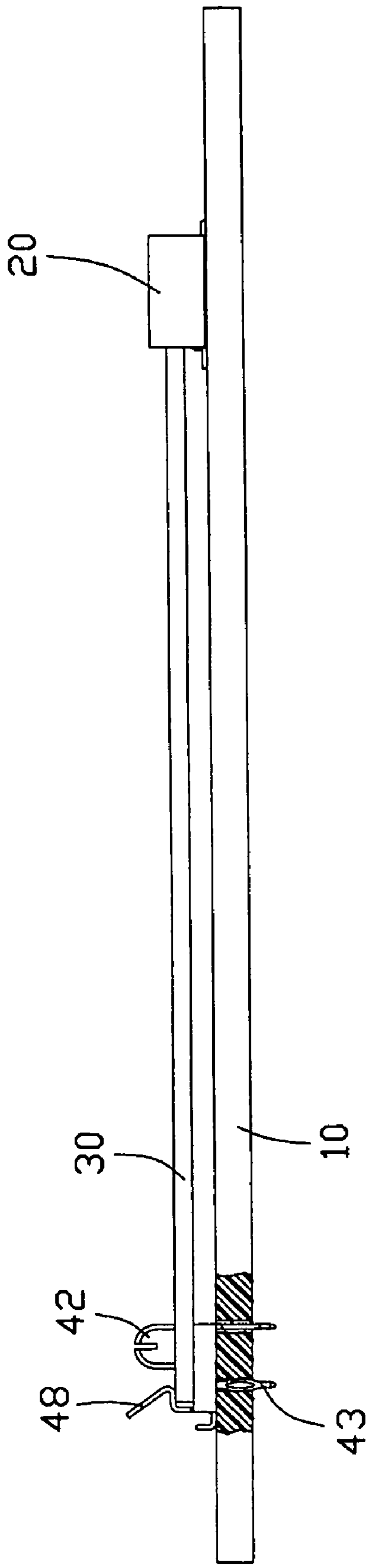
FIG. 4 is a side elevational and partially cross-sectional view of the electrical connector assembly of FIG. 3.
Figure 5:
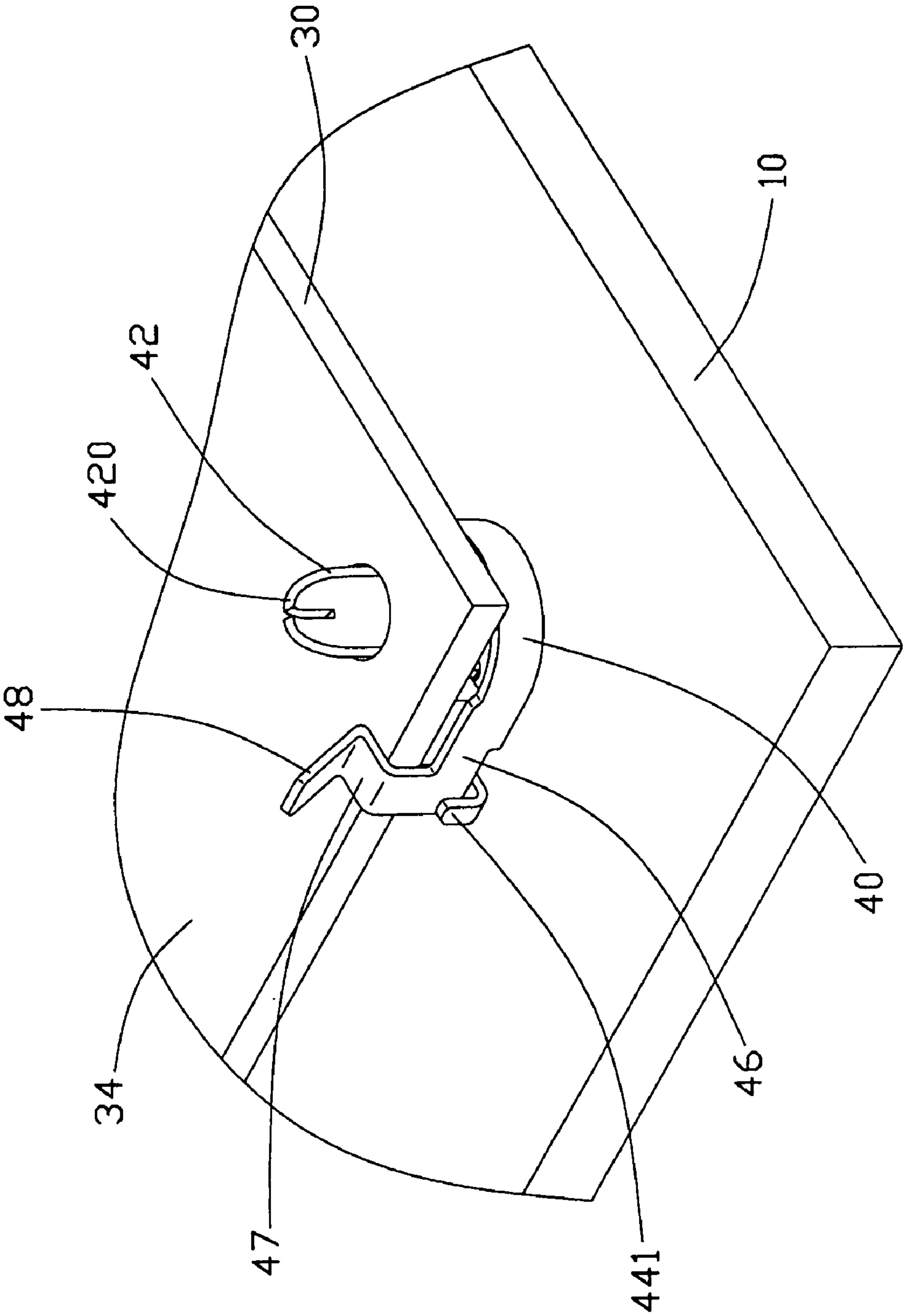
FIG. 5 is a partially enlarged perspective view of FIG. 3 but taken from another aspect.

Referring to FIGS. 3–5, in assembly of the electrical connector assembly 1, the card edge connector 20 is mounted on the upper surface 12 of the mother board 10 with tail portions (not labeled) of the contacts 23 being soldered to the solder pads 11 of the mother board 10. The board hold downs 40 are attached to the mother board 10 by the leg portions 43 inserted into the retention holes 13 of the mother board 10. The mating edge 31 of the daughter card 30 is inclinedly inserted into the slot 22 of the housing 21 to electrically connect the conductive pads 33 with the contacts 23. The rear edge 34 of the daughter card 30 is then pivoted downwardly. The locating portions 42 of the board hold downs 40 engage with the engaging holes 32 of the daughter card 30 by the guiding of the lead-ins 420 to precisely position the daughter card 30 for achieving a correct engagement between the daughter card 30 and the card edge connector 20. The body portion 41 of the board hold downs 40 support a lower face of the daughter card 30 to keep the daughter card 30 parallel to the mother board 10 and a predetermined distance therebetween. The latch portions 47 of the board hold downs 40 lock the rear edge 34 of the daughter card 30 to secure the daughter card 30 in the card edge connector 20 for ensuring a reliable connection therebetween. When the release portion 48 is deflected rearwardly to withdraw the latch portion 47, the rear edge 34 of the daughter card 30 rises up automatically for being removed from the card edge connector 20. The distal ends of the tabs 441 can prevent the resilient arms 46 from over-deflecting.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector assembly, comprising:

a mother board;

a card edge connector mounted on the mother board and comprising a housing defining a slot, and a plurality of contacts disposed on at least one side of the slot of the housing and exposed into the slot;

a daughter card comprising a mating edge inserted into the slot of the housing, a plurality of conductive pads on the mating edge for electrically connecting with contacts of the card edge connector; and a board hold down, which is separated from the card edge connector and mounted on the mother board, holding the daughter card in the card edge connector and keeping the daughter card parallel to the mother board; wherein the board hold down comprises a body portion supporting the daughter card to keep a predetermined distance between the daughter card and the mother board; wherein the board hold down comprises a resilient arm and an anti-overstress extending from a first and a second ends of the body portion, respectively.

2. The electrical connector assembly as claimed in claim 1, wherein the board hold down comprises a locating portion extending upwardly from the body portion, and wherein the daughter card defines an engaging hole engaged with the locating portion of the board hold down.

3. The electrical connector assembly claimed in claim 2, wherein the locating portion comprises a lead-in formed on a top end thereof for guiding the insertion of the locating portion into the engaging hole of the mother board.

4. The electrical connector assembly as claimed in claim 1, wherein the board hold down comprises a leg portion extending downwardly from the body portion, and wherein the mother board defines a retention hole receiving the leg portion of the board hold down.

5. The electrical connector assembly as claimed in claim 1, wherein the anti-overstress portion comprises a main section, and a tab perpendicularly extending from the main section and having an upwardly bent distal end.

6. The electrical connector assembly as claimed in claim 5, wherein the board hold down comprises a latch portion extending from the resilient arm and locking a rear edge of the daughter card.

7. The electrical connector assembly as claimed in claim 6, wherein the resilient arm is over the tab of the anti-overstress portion and is deflectable with the latch portion between the main section and the distal end of the tab.

8. An electrical connector assembly, comprising:

a mother board;

a card edge connector mounted on the mother board and comprising a housing defining a slot having an opening at one side of the card edge connector, and a plurality of contacts disposed on at least one side of the slot of the housing and exposed into the slot; and a board hold down mounted on the mother board, said board hold down being separated from and located beside the one side of card edge connector, the board hold down and the slot of housing together defining a support plane adapted for supporting a daughter card; wherein the board hold down comprises an arc-shaped body portion, a locating portion extending upwardly from the body portion, a pair of leg portions extending downwardly from the body portion, a resilient arm extending from a first end of the body portion, and a latch portion extending upwardly from the resilient arm.

9. The electrical connector assembly as claimed in claim 8, wherein the board hold down comprises an anti-overstress extending from a second end of the body portion, and including a main section and a tab perpendicularly extending from the main section with an upwardly bent distal end, and wherein the resilient arm is over the tab and is deflectable with the latch portion between the main section and the distal end of the tab.

10. An electrical connector assembly comprising:

a first circuit board;

a card edge connector mounted to the first circuit board and defining a slot with a plurality of contacts within said slot;

a second circuit board having a front edge section angularly inserted into the slot and downwardly rotated toward the first circuit board until reaching a parallel relation with the first circuit board; and at least one deflectable board holder mounted to the first circuit board; wherein said board holder is located around a rear edge section of the second circuit board, and downwardly presses said rear edge section; wherein said board holder includes a body portion, a locating portion upwardly extending from the body portion for supporting the second circuit board, a resilient arm and an anti-overstress portion respectively extending from opposite ends of the body portion of the board holder.

11. The assembly as claimed in claim 10, wherein a latch portion upwardly extends from the resilient arm and downwardly presses the rear section of the second circuit board.

12. The assembly as claimed in claim 10, wherein the anti-overstress comprises a main section facing the resilient arm, and a tab extending from the main section and beyond the resilient arm.

13. The assembly as claimed in claim 12, wherein the resilient arm is restrainedly moveable between the main section and the tab of the anti-overstress portion.

* * * * *